United States Patent
He et al.

(10) Patent No.: US 9,966,492 B1
(45) Date of Patent: May 8, 2018

(54) PIN PHOTODIODE, X-RAY DETECTING PIXEL, X-RAY DETECTING APPARATUS AND DETECTING METHOD THEREOF

(71) Applicants: BOE Technology Group Co., Ltd., Beijing (CN); Chengdu BOE Optoelectronics Technology Co., Ltd., Chengdu (CN)

(72) Inventors: Xiaoxiang He, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 0 days. days.

(21) Appl. No.: 15/526,853

(22) PCT Filed: Jun. 22, 2016

(86) PCT No.: PCT/CN2016/086699
§ 371 (c)(1),
(2) Date: May 15, 2017

(87) PCT Pub. No.: WO2017/161716
PCT Pub. Date: Sep. 28, 2017

(30) Foreign Application Priority Data

Mar. 21, 2016 (CN) .......................... 2016 1 0162640

(51) Int. Cl.
*G01T 1/24* (2006.01)
*H01L 31/115* (2006.01)
*H01L 31/075* (2012.01)

(52) U.S. Cl.
CPC .............. *H01L 31/115* (2013.01); *G01T 1/24* (2013.01); *H01L 31/075* (2013.01)

(58) Field of Classification Search
CPC ................. G01T 1/24; H01L 27/14676; H01L 27/14658; H01L 31/085; H01L 31/105; H01L 31/1085; H01L 31/115
(Continued)

(56) References Cited

U.S. PATENT DOCUMENTS 7,733,400 B2 * 6/2010 Lee .................. H01L 27/14643
250/208.1
9,312,421 B2 4/2016 Yamada et al.
(Continued)

FOREIGN PATENT DOCUMENTS

CN 1748412 A 3/2006
CN 101090138 A 12/2007
(Continued)

OTHER PUBLICATIONS

International Search Report and Written Opinion for International Application No. PCT/CN2016/086699, dated Dec. 7, 2016, 11 pages.
(Continued)

*Primary Examiner* — Taeho Jo
(74) *Attorney, Agent, or Firm* — Westman, Champlin & Koehler, P.A.

(57) ABSTRACT

The present application provides a PIN photodiode, an X-ray detecting pixel, an X-ray detecting apparatus and a detecting method thereof. The PIN photodiode may comprise a first doped layer, an intrinsic layer disposed over the first doped layer, and a second doped layer disposed over the intrinsic layer. The photodiode further comprises a third doped layer disposed over the second doped layer.

16 Claims, 4 Drawing Sheets

(58) Field of Classification Search
USPC .................................................. 250/370.09
See application file for complete search history.

(56) References Cited

U.S. PATENT DOCUMENTS

| | | | | |
|---|---|---|---|---|
| 2005/0012840 A1* | 1/2005 | Hsieh | ................ | H01L 27/14609 348/308 |
| 2005/0104089 A1* | 5/2005 | Engelmann | ................ | G01J 5/02 257/204 |
| 2006/0258080 A1* | 11/2006 | Takahashi | ........... | H01L 27/1214 438/231 |
| 2007/0131977 A1* | 6/2007 | Boisvert | ........... | H01L 27/14607 257/233 |
| 2008/0156966 A1* | 7/2008 | Hsieh | ................ | H01L 27/14609 250/208.1 |
| 2008/0191138 A1 | 8/2008 | Kastalsky et al. | | |
| 2009/0159940 A1* | 6/2009 | Sambandan | ...... | H01L 27/14658 257/292 |
| 2009/0224351 A1* | 9/2009 | Hsieh | ................ | H01L 27/14609 257/444 |
| 2010/0051819 A1 | 3/2010 | Jung et al. | | |
| 2011/0024863 A1 | 2/2011 | Koi et al. | | |
| 2012/0187455 A1* | 7/2012 | Brown | ...................... | G01J 1/04 257/229 |
| 2014/0312442 A1* | 10/2014 | Sasaki | ................... | G01T 1/2018 257/429 |
| 2016/0170046 A1* | 6/2016 | Kimura | ................. | H04N 3/155 378/64 |
| 2016/0359075 A1* | 12/2016 | Zhao | ..................... | H01L 31/105 |
| 2018/0017687 A1* | 1/2018 | Cao | ....................... | G01T 1/2928 |

FOREIGN PATENT DOCUMENTS

| | | |
|---|---|---|
| CN | 101221996 A | 7/2008 |
| CN | 102054771 A | 5/2011 |
| CN | 102800735 A | 11/2012 |
| CN | 102916085 A | 2/2013 |
| CN | 103646986 A | 3/2014 |
| CN | 104900669 A | 9/2015 |

OTHER PUBLICATIONS

English translation of International Search Report and Written Opinion for International Application No. PCT/CN2016/086699, dated Dec. 7, 2016, 10 pages.

First Office Action, including Search Report, for Chinese Patent Application No. 201610162640.1, dated Feb. 4, 2017, 7 pages.

* cited by examiner

PIN PHOTODIODE, X-RAY DETECTING PIXEL, X-RAY DETECTING APPARATUS AND DETECTING METHOD THEREOF

CROSS-REFERENCE TO RELATED APPLICATION(S)

This application is a Section 371 National Stage Application of International Application No. PCT/CN2016/086699, filed on 22 Jun. 2016, entitled "PIN PHOTODIODE, X-RAY DETECTING PIXEL, X-RAY DETECTING APPARATUS AND DETECTING METHOD THEREOF", which claims priority to Chinese Application CN201610162640.1, filed on 21 Mar. 2016, incorporated herein by reference in their entirety.

TECHNICAL FIELD

The present application relates to a field of display technology, and more particularly, to a PIN photodiode, an X-ray detecting pixel, an X-ray detecting apparatus, and a detecting method thereof.

BACKGROUND

Recently, X-ray detectors have been widely used in medical imaging industry and been considered as the doctor's eyes. X-ray detectors can be divided into direct type X-ray detectors and indirect type X-ray detectors. Direct type X-ray detectors use a high dose of X-rays to image, which may bring the human body an additional damage. Compared with the direct type X-ray detectors, indirect type X-ray detectors use a relatively low dose of X-rays by using the PIN photodiode. Thus, indirect X-ray detectors have gradually become the mainstream of the market.

However, a surface of the PIN photodiode is defective due to the periodic damage of the N+doped layer in the PIN photodiode, resulting in a presence of a defective dark current. The defective dark current can induce a noise, which will affect the image quality. In addition, the X-ray detector may include two switching transistors (a resetting switching transistor and a row-selected switching transistor). In a resetting phase, the voltage of the N+doped layer in the PIN photodiode is reset to a power supply voltage Vdd by the resetting switching transistor. In a reading phase, a row-selected signal has a high level of Vdd, and the row-selected switching transistor may have a loss of Vth during the reading. In other words, when being irradiated by the X-rays, the PIN photodiode will generate photon electron-hole pairs. Thus, the N+doped layer in the PIN photodiode may have a voltage drop. The voltage can be completely read out by the row-selected switching transistor when the voltage drop is greater than Vth. Therefore, an additional X-ray dose is required to compensate such a Vth loss, which results in wasting the dose of X-rays.

Therefore, those skilled in the art is aimed at solving the problem of the presence of defective dark current on the surface of the PIN photodiode, thereby improving the image quality of the X-ray detector and reducing the dose of the used X-rays.

SUMMARY

An embodiment of the present application may provide a PIN photodiode, comprising:
a first doped layer;
an intrinsic layer, disposed over the first doped layer;
a second doped layer, disposed over the intrinsic layer,
wherein the photodiode may further comprises a third doped layer disposed over the second doped layer.

According to an alternative embodiment, in the PIN photodiode discussed above, the first doped layer and the third doped layer are P-type semiconductor layers, and the second doped layer is an N-type semiconductor layer.

Another embodiment of the present application may provide an X-ray detecting pixel, comprising:
the PIN photodiode according to the embodiment of the present application;
a resetting unit, having a control terminal connected with a resetting signal terminal to receive a resetting signal, an input terminal connected with a power supply signal terminal to receive a power supply signal, and an output terminal connected with the third doped layer of the PIN photodiode, wherein the resetting unit is configured to reset the PIN photodiode via the power supply signal, under the control of the resetting signal; and
an outputting unit, having a control terminal connected with a controlling signal terminal to receive a controlling signal, an input terminal connected with the second doped layer of the PIN photodiode to receive an electrical signal generated by the PIN photodiode after being irradiated by X-rays, and an output terminal connected with an outputting terminal of the X-ray detecting pixel, wherein the outputting unit is configured to output the electrical signal, under the control of the controlling signal.

According to an alternative embodiment, in the X-ray detecting pixel, the resetting unit may comprise a first switching transistor having a gate connected with the resetting signal terminal, a source connected with the power supply signal terminal, and a drain connected with the third doped layer of the PIN photodiode.

According to an alternative embodiment, in the X-ray detecting pixel, the outputting unit may comprise a second switching transistor having a gate connected with the controlling signal terminal, a source connected with the second doped layer of the PIN photodiode, and a drain connected with the outputting terminal of the X-ray detecting pixel, so as to output the electrical signal generated by the PIN photodiode after being irradiated by X-rays.

According to an alternative embodiment, in the X-ray detecting pixel, the third doped layer is a P-type semiconductor layer and the second doped layer is an N-type semiconductor layer, and a PN junction consisted of the third doped layer and the second dopant layer has a turning on voltage being equal to a threshold voltage of the second switching transistor.

Yet another embodiment of the present application may provide a digital X-ray detecting apparatus, comprising: a plurality of the X-ray detecting pixels according to the embodiments of the present application, arranged in an array; a plurality of turning on signal lines; a plurality of reading signal lines; a plurality of reading units; and an display unit, wherein:
each of the turning on signal lines corresponds to a row of the X-ray detecting pixels, and is configured to input the controlling signal to the control terminals of the outputting units of the X-ray detecting pixels in that row;
each column of the X-ray detecting pixels corresponds to a reading unit and a reading signal line, wherein the reading unit is configured to read the electrical signal output from the column of the X-ray detecting pixels through a corresponding reading signal line; and the display unit is configured to generate an image based on the electrical signals read by the plurality of reading units.

Still another embodiment of the present application may provide a detecting method for the digital X-ray detecting apparatus according to the above embodiments, comprising:

in a resetting phase, the resetting unit resets the PIN photodiode by the power supply signal, under the control of the resetting signal;

in an irradiating phase, the PIN photodiode is irradiated by X-rays;

in an outputting phase, the outputting unit outputs an electrical signal generated by the PIN photodiode after being irradiated by X-rays, via its output terminal;

in a reading phase, the reading unit reads the electrical signal outputted by the outputting unit; and in a displaying phase, the display unit generates an image based on the electrical signal read by the reading unit.

DETAILED DESCRIPTION

Embodiments of the present application may provide a PIN photodiode, an X-ray detecting pixel, an X-ray detecting apparatus and a detecting method thereof, which can at least solve the problem of the present of the defective dark current on a surface of the PIN photodiode, improve the image quality of the X-ray detector and reduce the dose of X-rays.

Hereinafter, a specific description of a PIN photodiode, an X-ray detecting pixel, an X-ray detecting apparatus, and a detecting method thereof according to the embodiments of the present application will be provided with reference to the accompanying drawings.

Figure 1:
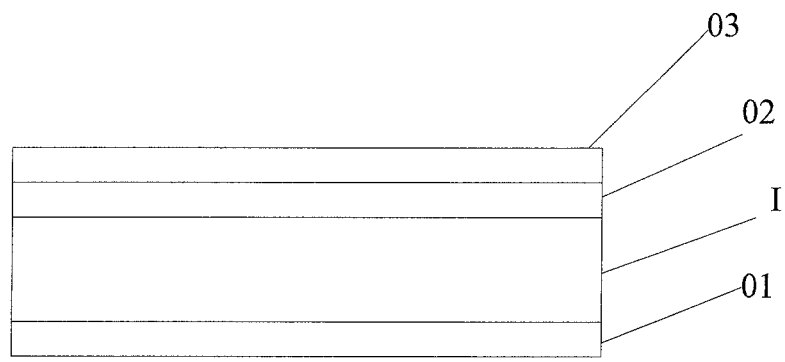
FIG. 1 shows a structural diagram of a PIN photodiode according to an embodiment of the present application.

As shown in FIG. 1, the PIN photodiode according to an embodiment of the present application may comprise a first doped layer 01, an intrinsic layer I, and a second doped layer 02. Furthermore, the PIN photodiode may further comprise a third doped layer 03. The intrinsic layer I is disposed over the first doped layer 01, the second doped layer 02 is disposed over the intrinsic layer I, and the third doped layer 03 is disposed over the second doped layer 02.

The PIN photodiode according to the present embodiment can prevent the second doped layer 02 from being periodically damaged by disposing the third doped layer 03 over the second doped layer 02, thereby preventing the surface of the second doped layer 02 from being damaged. The PIN photodiode according to the present embodiment can improve the defective dark current caused by surface defects of the doped layer, meanwhile it can improve the image quality when being applied to an X-ray detector.

In an implementation, in the PIN photodiode of the present embodiment, the first doped layer 01 and the third doped layer 03 are P-type semiconductor layers, and the second doped layer 02 is an N-type semiconductor layer. Specifically, in the above-described PIN photodiode, the second doped layer 02 and the third doped layer 03 may form a PN junction. In a resetting phase, the voltage of the third doped layer 03 of the PIN photodiode is reset to a power supply signal voltage Vdd. At this time, the voltage of the second doped layer is Vdd-Vdth, where Vdth is the turning on voltage of the PN junction. When the PIN photodiode is applied to an X-ray detector, the magnitude of the Vdth can be adjusted to be equal to that of a threshold voltage Vth of a row-selected switching transistor, so that the loss of Vth can be reduced or eliminated, thereby reducing or eliminating the need for increasing the dose of X-rays to compensate for the loss of Vth, which may effectively reduce the dose of X-rays.

Figure 2:
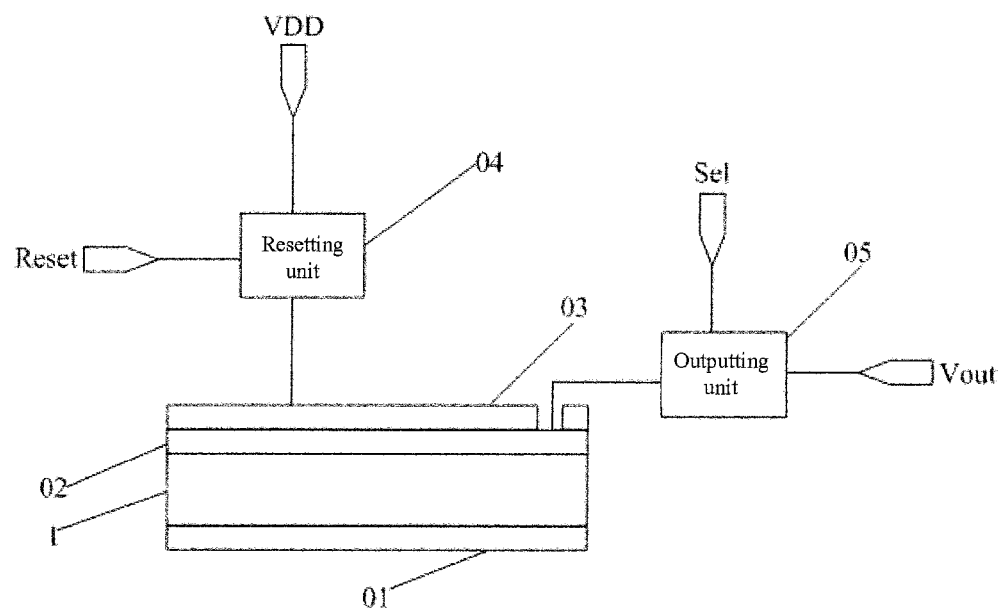
FIG. 2 shows a structural diagram of an X-ray detecting pixel according to an embodiment of the present application.

Based on the same inventive concept, another embodiment of the present application provides an X-ray detecting pixel, as shown in FIG. 2. The X-ray detecting pixel may include the PIN photodiode according to the above embodiments, a resetting unit 04, and an outputting unit 05.

The resetting unit may have a control terminal connected with a resetting signal terminal (Reset) to receive a resetting signal, an input terminal connected with a power supply signal terminal (VDD) to receive a power supply signal, and an output terminal connected with the third doped layer 03 of the PIN photodiode. The resetting unit 04 is configured to reset the PIN photodiode via the power supply signal, under the control of the resetting signal. The outputting unit may have a control terminal connected with a controlling signal terminal (Sel) to receive a controlling signal, an input terminal connected with the second doped layer 02 of the PIN photodiode, and an output terminal connected with an outputting terminal (Vout) of the X-ray detecting pixel. The outputting unit 05 is configured to output an electrical signal generated by the PIN photodiode after being irradiated by X-rays, under the control of the controlling signal.

Specifically, in the X-ray detecting pixel according to the embodiment of the present application, the resetting unit 04 can reset the PIN photodiode, and the outputting unit 05 can output the electrical signal generated by the PIN photodiode for displaying. It is possible to prevent the second doped layer from being damaged by disposing the third doped layer over the second doped layer, thereby improving the defective dark current caused by surface defects of the doped layer and improving the image quality. In the resetting phase, the resetting unit 04 is turned on under the resetting signal, so as to output the power supply signal to the third doped layer of the PIN photodiode. At this time, the voltage of the third doped layer is Vdd, and the voltage of the second layer is Vdd-Vdth, wherein the Vdth is the turning on voltage of the PN junction between the third doped layer and the second doped layer. The magnitude of the Vdth can be adjusted to be equal to that of a threshold voltage Vth of the outputting unit 05, so that the loss of Vth can be reduced or eliminated, thereby reducing or eliminating the need for increasing the dose of X-rays to compensate for the loss of Vth, which may effectively reduce the dose of X-rays.

Figure 3:
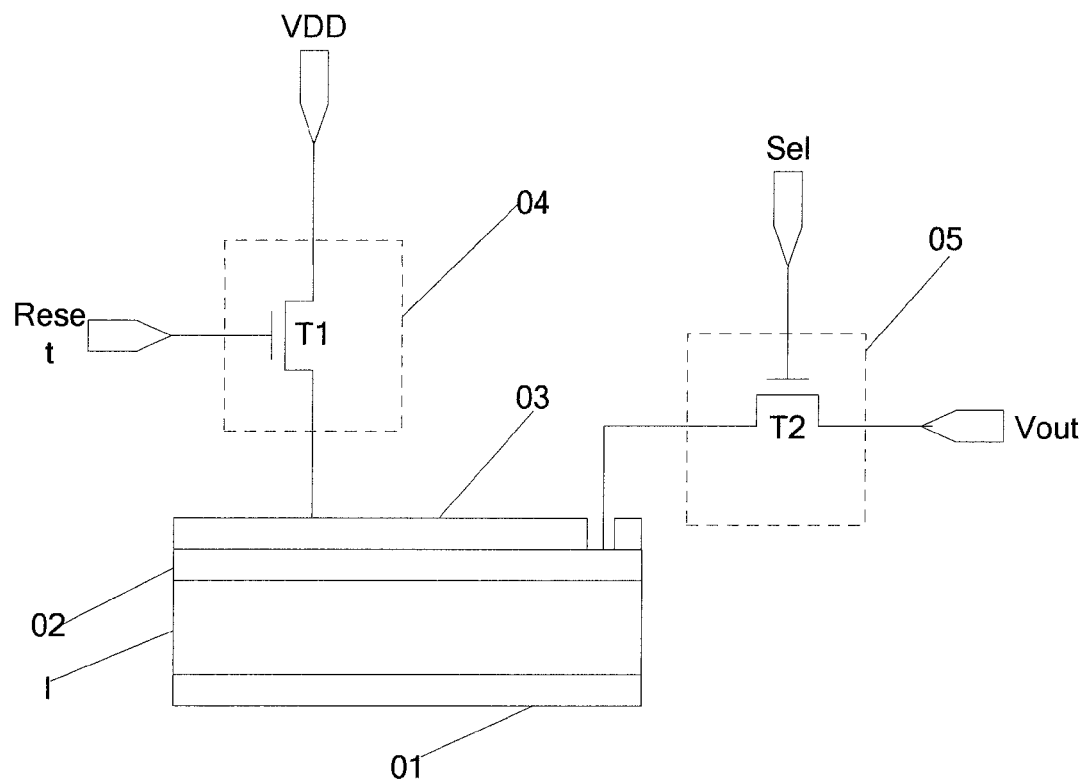
FIG. 3 illustrates a specific structural diagram of the X-ray detecting pixel according to the embodiment of the present application.

In an implementation, in the X-ray detecting pixel according to the embodiments of the present disclosure, as shown in FIG. 3, the resetting unit 04 may comprise a first switching transistor T1. The first switch transistor T1 may have a gate connected with the resetting signal terminal (Reset), a source connected with the power supply signal terminal (VDD), and a drain connected with the third doped layer 03 of the PIN photodiode. Specifically, in a resetting phase, the first switching transistor T1 is turned on under the control of the resetting signal, so as to output the power supply signal to the third doped layer 03 of the PIN photodiode, and to reset the voltage of the third doped layer 03 of the PIN photodiode to Vdd. Since the turning on voltage Vdth exists between the second doped layer 02 and the third doped layer 03, the voltage of the second doped layer 02 of the PIN photodiode is Vdd-Vdth.

In an implementation, in the X-ray detecting pixel according to the embodiments of the present disclosure, as shown in FIG. 3, the outputting unit 05 may comprise a second switching transistor T2. The second switching transistor T2 may have a gate connected with the controlling signal terminal (Sel), a source connected with the second doped layer 02 of the PIN photodiode, and a drain connected with the outputting terminal (Vout) of the X-ray detecting pixel, so as to output an electrical signal generated by the PIN photodiode after being irradiated by X-rays. Specifically, the source of the second switching transistor T2 may be connected to the second doped layer 02 of the PIN photodiode through a via. The PIN photodiode will generate electron-hole pairs when being irradiated with X-rays, thereby causing a voltage of the second doped layer 02 (N-type semiconductor layer) to be changed. The second switching transistor T2 can be turned on under the control of the controlling signal, and then the changed voltage signal of the second doped layer can be outputted.

In an implementation, in the X-ray detecting pixel according to the embodiments of the present disclosure, the third doped layer is a P-type semiconductor layer and the second doped layer is an N-type semiconductor layer. In order to reduce or eliminate the need for increasing the dose of X-rays to compensate for the loss of Vth and reduce the dose of the X-rays effectively, a PN junction consisted of the third doped layer and the second dopant layer may have a turning on voltage Vdth being equal to the threshold voltage Vth of the second switching transistor. In particular, it is possible to adjust the magnitude of the turning on voltage Vdth between the second doped layer and the third doped layer by adjusting the doping concentration of the second doped layer and the third doped layer. Of course, it is also possible to adjust the magnitude of the turning on voltage of the PN junction and the threshold voltage of the switching transistor by adjusting other parameters, which are not limited herein.

Figure 4:
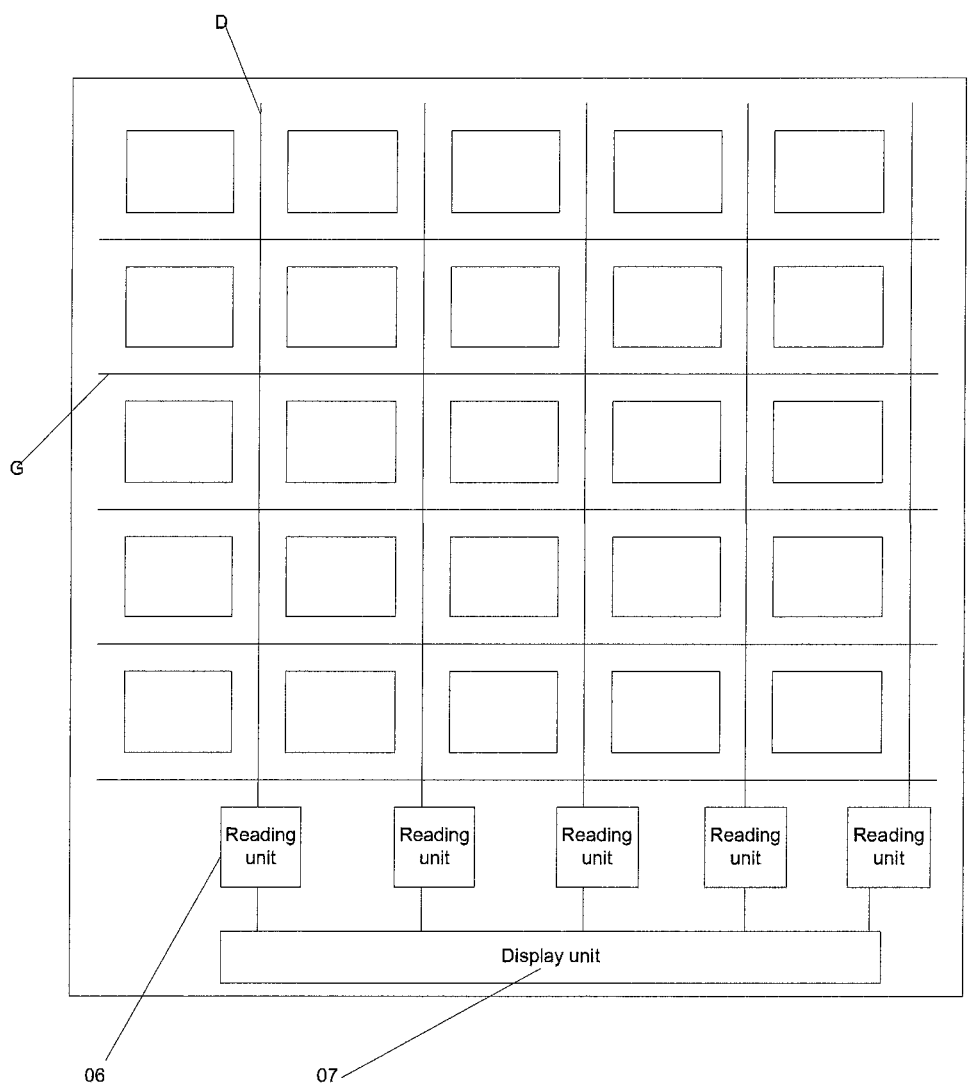
FIG. 4 illustrates a schematic diagram of a digital X-ray detecting apparatus according to an embodiment of the present application.

Based on the same inventive concept, as shown in FIG. 4, another embodiment of the present disclosure may provide a digital X-ray detecting apparatus, which may comprise: a plurality of the X-ray detecting pixels according to the above embodiments, arranged in an array; a plurality of turning on signal lines G; a plurality of reading signal lines D; a plurality of reading units 06, and an display unit 07. Each of the turning on signal lines G corresponds to a row of the X-ray detecting pixels, and is configured to input the controlling signal to the control terminals of the outputting units of the X-ray detecting pixels in that row. Each column of the X-ray detecting pixels corresponds to a reading unit 06 and a reading signal line D, wherein the reading unit 06 is configured to read the electrical signal output from the column of the X-ray detecting pixels through a corresponding reading signal line D. The display unit 07 is configured to generate an image based on the electrical signals read by the plurality of reading units 06.

In the digital X-ray detecting apparatus according to the present embodiment, the reading units 06 read the electric signals outputted from the X-ray detecting pixel, and the displaying unit 07 generates the image based on the electric signals read by the reading units 06. The PIN photodiode according to the present embodiment can prevent the second doped layer from being periodically damaged by disposing the third doped layer over the second doped layer, thereby solving the problem of existing defective dark current in the PIN photodiode and improving the image quality. Further, It is possible to reduce or eliminate the need for increasing the dose of X-rays to compensate for the loss caused by the threshold voltage, by setting the turning on voltage between the second and third doped layers to be equal to the threshold voltage of the outputting unit, thereby reducing the dose of X-rays effectively.

Figure 5:
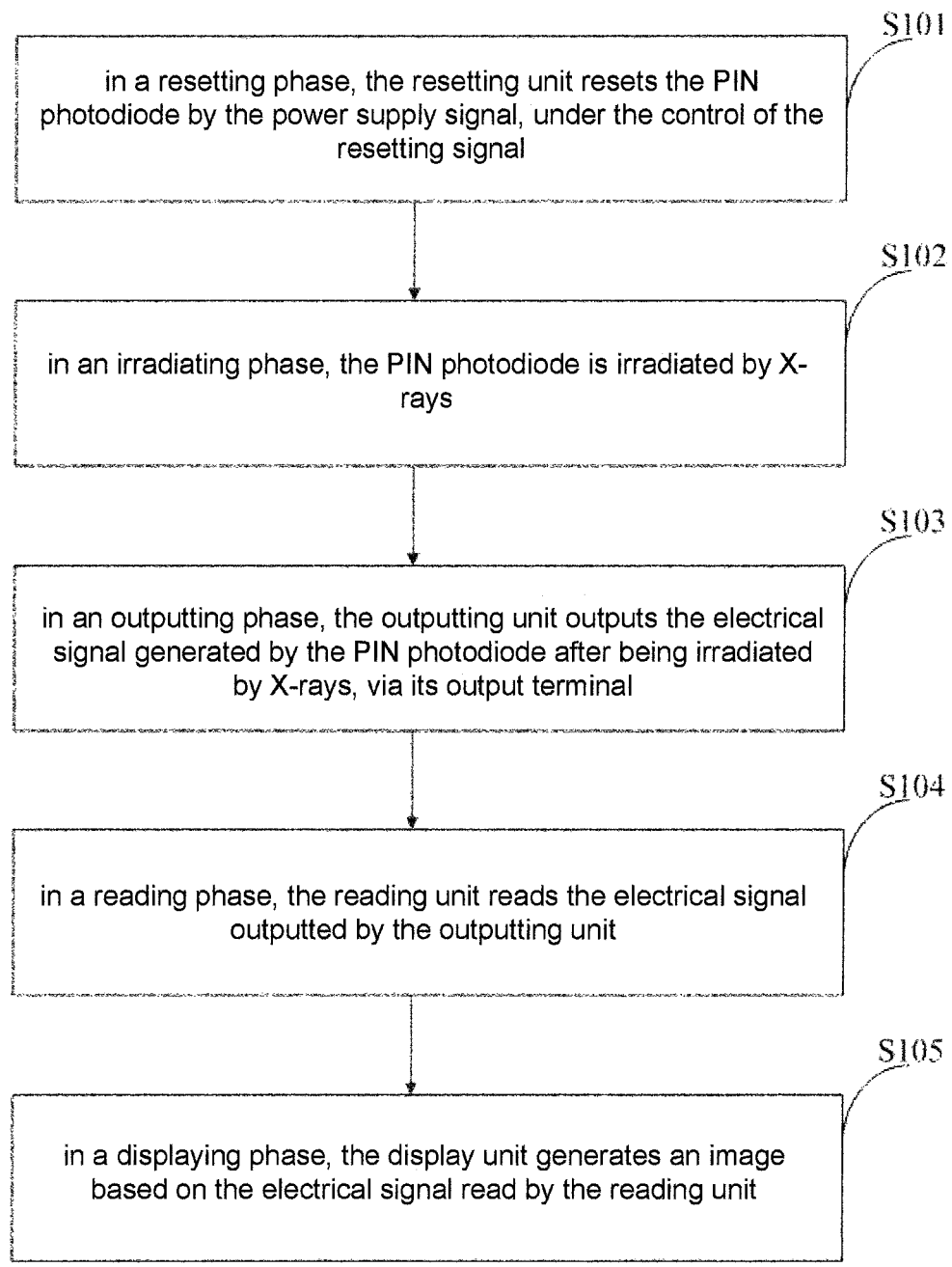
FIG. 5 illustrates a flow chart of a detecting method for a digital X-ray detecting apparatus according to an embodiment of the present application.

Based on the same inventive concept, an embodiment of the present application provides a detecting method for the above-described digital X-ray detecting apparatus according to the present embodiment. As shown in FIG. 5, the detecting method may include:

at S101, in a resetting phase, the resetting unit resets the PIN photodiode by the power supply signal, under the control of the resetting signal;

at S102, in an irradiating phase, the PIN photodiode is irradiated by X-rays;

at S103, in an outputting phase, the outputting unit outputs the electrical signal generated by the PIN photodiode after being irradiated by X-rays, via its output terminal;

at S104, in a reading phase, the reading unit reads the electrical signal outputted by the outputting unit; and;

at S105, in a displaying phase, the display unit generates an image based on the electrical signal read by the reading unit.

In the above-described detecting method according to the embodiment of the present invention, at a resetting phase, the voltage of the third doped layer in the PIN photodiode is reset to Vdd by the resetting unit. Since there is a turning-on voltage Vdth between the second doped layer and the third doped layer, the voltage of the second doped layer is reset to Vdd-Vdth. The magnitude of the Vdth can be adjusted to be equal to that of the threshold voltage Vth of the outputting unit. When reading the electrical signal generated by the PIN photodiode, it is possible to reduce or eliminate the loss of Vth. In other words, the voltage of the second doped layer of the PIN photodiode is Vdd-Vth before the X-ray begins to irradiate, which can be read out completely by the reading unit, thus reducing or eliminating the need for increasing X-ray dose to compensate for the Vth.

The embodiments of the present application may provide a PIN photodiode, an X-ray detecting pixel, an X-ray detecting apparatus and a detecting method thereof. The PIN photodiode may comprise a first doped layer; an intrinsic layer, disposed over the first doped layer; and a second doped layer, disposed over the intrinsic layer, wherein the photodiode further comprises a third doped layer disposed over the second doped layer. Specifically, the PIN photodiode according to the present embodiment can prevent the second doped layer from being periodically damaged by disposing the third doped layer over the second doped layer, thereby preventing the surface of the second doped layer from being damaged. The PIN photodiode according to the present embodiment can improve the defective dark current caused by surface defects of the doped layer, meanwhile it can improve the image quality when being applied to an X-ray detector. Further, the loss of the Vth can be reduced or eliminated by setting the turning on voltage between the second doped layer and the third doped layer to be equal to the threshold voltage Vth of the outputting unit of the X-ray detecting pixel, thereby reducing or eliminating the need for increasing the dose of X-rays to compensate for the loss of the Vth and further reducing the dose of the X-rays effectively It will be apparent to those skilled in the art that various changes and modifications can be made in this application without departing from the spirit and scope of the present application. In this manner, the present application is intended to include such variations and variations if these modifications and variations of this application are within the scope of the appended claims and the equivalents thereof.

We claim:

1. An X-ray detecting pixel, comprising:
   a PIN photodiode comprising a first doped layer; an intrinsic layer, disposed over the first doped layer; and a second doped layer, disposed over the intrinsic layer wherein the PIN photodiode further comprises a third doped layer disposed over the second doped layer;
   a resetting unit, having a control terminal connected with a resetting signal terminal to receive a resetting signal, an input terminal connected with a power supply signal terminal to receive a power supply signal, and an output terminal connected with the third doped layer of the PIN photodiode, wherein the resetting unit is configured to reset the PIN photodiode via the power supply signal, under the control of the resetting signal; and
   an outputting unit, having a control terminal connected with a controlling signal terminal to receive a controlling signal, an input terminal connected with the second doped layer of the PIN photodiode to receive an electrical signal generated by the PIN photodiode after being irradiated by X-rays, and an output terminal connected with an outputting terminal of the X-ray detecting pixel, wherein the outputting unit is configured to output the electrical signal, under the control of the controlling signal.

2. The X-ray detecting pixel according to claim 1, wherein the resetting unit comprises a first switching transistor having a gate connected with the resetting signal terminal, a source connected with the power supply signal terminal, and a drain connected with the third doped layer of the PIN photodiode.

3. The X-ray detecting pixel according to claim 1, wherein the outputting unit comprises a second switching transistor having a gate connected with the controlling signal terminal, a source connected with the second doped layer of the PIN photodiode, and a drain connected with the outputting terminal of the X-ray detecting pixel, so as to output the electrical signal generated by the PIN photodiode after being irradiated by X-rays.

4. The X-ray detecting pixel according to claim 3, wherein the third doped layer is a P-type semiconductor layer and the second doped layer is an N-type semiconductor layer, and a PN junction consisted of the third doped layer and the second dopant layer has a turning on voltage being equal to a threshold voltage of the second switching transistor.

5. The X-ray detecting pixel according to claim 4, wherein the magnitude of the turning on voltage Vdth is adjusted by adjusting the doping concentration of the second doped layer and the third doped layer.

6. A digital X-ray detecting apparatus, comprising: a plurality of the X-ray detecting pixels according to claim 1, arranged in an array, a plurality of turning on signal lines, a plurality of reading signal lines, a plurality of reading units, and an display unit, wherein:
   each of the turning on signal lines corresponds to a row of the X-ray detecting pixels, and is configured to input the controlling signal to the control terminals of the outputting units of the X-ray detecting pixels in that row;
   each column of the X-ray detecting pixels corresponds to a reading unit and a reading signal line, wherein the reading unit is configured to read an electrical signal output from the column of the X-ray detecting pixels through a corresponding reading signal line; and
   the display unit is configured to generate an image based on electrical signals read by the plurality of reading units.

7. A detecting method for the digital X-ray detecting apparatus according to claim 6, comprising:
   in a resetting phase, the resetting unit resets the PIN photodiode by the power supply signal, under the control of the resetting signal;
   in an irradiating phase, the PIN photodiode is irradiated by X-rays;
   in an outputting phase, the outputting unit outputs the electrical signal generated by the PIN photodiode after being irradiated by X-rays, via its output terminal;
   in a reading phase, the reading unit reads the electrical signal outputted by the outputting unit; and
   in a displaying phase, the display unit generates an image based on the electrical signal read by the reading unit.

8. The detecting method according to claim 7, wherein the resetting unit comprises a first switching transistor having a gate connected with the resetting signal terminal, a source connected with the power supply signal terminal, and a drain connected with the third doped layer of the PIN photodiode.

9. The detecting method according to claim 7, wherein the outputting unit comprises a second switching transistor having a gate connected with the controlling signal terminal, a source connected with the second doped layer of the PIN photodiode, and a drain connected with the outputting terminal of the X-ray detecting pixel, so as to output the electrical signal generated by the PIN photodiode after being irradiated by X-rays.

10. The detecting method 1 according to claim 9, wherein the third doped layer is a P-type semiconductor layer and the second doped layer is an N-type semiconductor layer, and a PN junction consisted of the third doped layer and the second dopant layer has a turning on voltage being equal to a threshold voltage of the second switching transistor.

11. The detecting method according to claim 10, wherein the magnitude of the turning on voltage Vdth is adjusted by adjusting the doping concentration of the second doped layer and the third doped layer.

12. The digital X-ray detecting apparatus according to claim 6, wherein the resetting unit comprises a first switching transistor having a gate connected with the resetting signal terminal, a source connected with the power supply signal terminal, and a drain connected with the third doped layer of the PIN photodiode.

13. The digital X-ray detecting apparatus according to claim 6, wherein the outputting unit comprises a second switching transistor having a gate connected with the controlling signal terminal, a source connected with the second doped layer of the PIN photodiode, and a drain connected with the outputting terminal of the X-ray detecting pixel, so as to output the electrical signal generated by the PIN photodiode after being irradiated by X-rays.

14. The digital X-ray detecting apparatus according to claim 13, wherein the third doped layer is a P-type semiconductor layer and the second doped layer is an N-type semiconductor layer, and a PN junction consisted of the third doped layer and the second dopant layer has a turning on voltage being equal to a threshold voltage of the second switching transistor.

15. The digital X-ray detecting apparatus according to claim 14, wherein the magnitude of the turning on voltage Vdth is adjusted by adjusting the doping concentration of the second doped layer and the third doped layer.

16. The PIN photodiode according to claim 1, wherein the first doped layer and the third doped layer are P-type semiconductor layers, and the second doped layer is an N-type semiconductor layer.

* * * * *